United States Patent
Cho et al.

(10) Patent No.: US 9,502,692 B2
(45) Date of Patent: Nov. 22, 2016

(54) ORGANIC LIGHT-EMITTING DIODE (OLED) DISPLAY

(71) Applicant: Samsung Display Co., Ltd., Yongin-si, Gyeonggi-do (KR)

(72) Inventors: Kwan-Hyun Cho, Yongin-si (KR); Jin-Koo Chung, Yongin-si (KR); Jun-Ho Choi, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/965,024

(22) Filed: Dec. 10, 2015

(65) Prior Publication Data

US 2016/0099438 A1 Apr. 7, 2016

Related U.S. Application Data

(63) Continuation of application No. 14/469,395, filed on Aug. 26, 2014, now Pat. No. 9,245,931.

(30) Foreign Application Priority Data

Feb. 13, 2014 (KR) .................. 10-2014-0016795

(51) Int. Cl.
*H01L 51/52* (2006.01)
*H01L 27/32* (2006.01)
*H01L 51/00* (2006.01)

(52) U.S. Cl.
CPC ......... *H01L 51/5281* (2013.01); *H01L 27/326* (2013.01); *H01L 27/3244* (2013.01);
(Continued)

(58) Field of Classification Search
CPC ........... H01L 27/3276; H01L 27/3279; H01L 51/5203; H01L 27/3258; H01L 27/326; H01L 2251/5315; H01L 51/5234; H01L 51/5275; H01L 51/5228; H01L 51/5237
USPC .................................................. 313/498–512
See application file for complete search history.

(56) References Cited

U.S. PATENT DOCUMENTS 8,530,910 B2   9/2013 Song et al.
8,872,206 B2   10/2014 Chung et al.
(Continued)

FOREIGN PATENT DOCUMENTS

KR   10-2010-0081773 A   7/2010
KR   10-2011-0058126 A   6/2011
(Continued)

*Primary Examiner* — Donald Raleigh
*Assistant Examiner* — Kevin Quarterman
(74) *Attorney, Agent, or Firm* — Knobbe, Martens, Olson & Bear, LLP

(57) ABSTRACT

An organic light-emitting diode (OLED) display is disclosed. In one aspect, the OLED display includes a plurality of pixels and each pixel includes a first area configured to emit light and a second area configured to transmit external light therethrough. Each pixel also includes a first electrode formed in the first area and an organic layer formed in the first area and the second area, wherein the organic layer covers the first electrode. Each pixel further includes a second electrode covering at least the organic layer formed in the first area and having a first opening exposing at least a portion of the organic layer formed in the second area. A reflection prevention layer is formed substantially covering the organic layer formed in the second area. The reflection prevention layer has a refractive index lower than that of the organic layer.

13 Claims, 11 Drawing Sheets

(52) U.S. Cl.
CPC ....... *H01L27/3248* (2013.01); *H01L 27/3258* (2013.01); *H01L 51/0077* (2013.01); *H01L 51/5218* (2013.01); *H01L 51/5268* (2013.01); *H01L 51/5271* (2013.01); *H01L 51/5275* (2013.01); *H01L 2251/301* (2013.01)

(56) References Cited

U.S. PATENT DOCUMENTS

| | | |
|---|---|---|
| 2004/0066136 A1 | 4/2004 | Yoneda et al. |
| 2005/0046342 A1 | 3/2005 | Park et al. |
| 2005/0127820 A1 | 6/2005 | Yamazaki et al. |
| 2005/0179379 A1 | 8/2005 | Kim |
| 2010/0052519 A1 | 3/2010 | Jeon et al. |
| 2010/0171106 A1 | 7/2010 | Jung et al. |
| 2011/0121271 A1 | 5/2011 | Jeon et al. |
| 2011/0169720 A1 | 7/2011 | Hwang et al. |
| 2011/0204388 A1 | 8/2011 | Jeong et al. |
| 2012/0049206 A1 | 3/2012 | Choi et al. |
| 2013/0161656 A1 | 6/2013 | Choi et al. |

FOREIGN PATENT DOCUMENTS

| | | |
|---|---|---|
| KR | 10-2011-0096451 A | 8/2011 |
| KR | 10-2012-0019025 A | 3/2012 |
| KR | 10-2013-0073721 A | 7/2013 |

ORGANIC LIGHT-EMITTING DIODE (OLED) DISPLAY

RELATED APPLICATIONS

This application is a continuation of application Ser. No. 14/469,395, filed Aug. 26, 2014, which claims the benefit of Korean Patent Application No. 10-2014-0016795, filed on Feb. 13, 2014, in the Korean Intellectual Property Office, the disclosure of which is incorporated herein in its entirety by reference.

BACKGROUND

1. Field

The described technology generally relates to an organic light-emitting diode (OLED) display.

2. Description of the Related Technology

Organic light-emitting diode (OLED) displays are exceptional in terms of viewing angle, contrast, response speeds, power consumption, etc., and thus can be applied to a variety of applications that range from a personal mobile device such as an MP3 player or a cellular phone to a TV. OLED displays are self-emissive and do not need a separate light source in contrast to liquid crystal displays (LCDs). Accordingly, the thickness and weight of OLED displays are comparatively reduced with respect to displays having a separate light source. OLED displays can include a transmission area (or a transmission window) in addition to an area in which a thin film transistor and/or an OLED are formed. Such OLED displays function as a transparent display through which external light can be transmitted.

SUMMARY OF CERTAIN INVENTIVE ASPECTS

One inventive aspect is an organic light-emitting diode (OLED) display through which external light can be transmitted.

Another aspect is an OLED display including a plurality of pixels each including a first area in which light emits and a second area through which external light transmits; a plurality of thin film transistors formed in the first area of each of the plurality of pixels; a plurality of first electrodes independently formed in the first area of each of the plurality of pixels and respectively connected to the plurality of thin film transistors; an organic layer provided on the first electrode and on a position corresponding to the second area; a second electrode covering the organic layer, connected over the plurality of pixels, and including a first transmission window on a position corresponding to the second area; a refractive auxiliary layer provided on the second electrode on a position corresponding to the first area; and a reflective prevention layer provided on the organic layer on a position corresponding to the second area and having a lower refractive index than that of the organic layer.

The reflective prevention layer may have a lower refractive index than that of the refractive auxiliary layer.

The reflective prevention layer may include: a first layer provided on the organic layer; and a second layer provided on the first layer and having a lower refractive index than that of the first layer.

The reflective prevention layer may include irregularities on a surface thereof.

The refractive auxiliary layer may be formed of 8-quinolionlato lithium.

The reflective prevention layer may include at least one of lithium fluoride (LiF) and 8-hydroxyquinolatolithum (Liq).

The first layer may include Liq and the second layer may include LiF.

The OLED display may further include: at least one insulating layer covering the plurality of thin film transistors, wherein a second transmission window that overlaps the first transmission window is provided in the at least one insulating layer on a position corresponding to the second area.

The first electrode may be provided as a light reflective electrode.

The first area may include a circuit area in which the plurality of thin film transistors are formed and an emission area in which the first electrode is formed and wherein the circuit area and the emission area of each of the plurality of pixels overlap each other.

The first transmission window may be independently provided in each of the plurality of pixels.

The first transmission window may be connected with respect to at least two of the plurality of pixels that are adjacent to each other.

DETAILED DESCRIPTION OF CERTAIN INVENTIVE EMBODIMENTS

Figure 1:
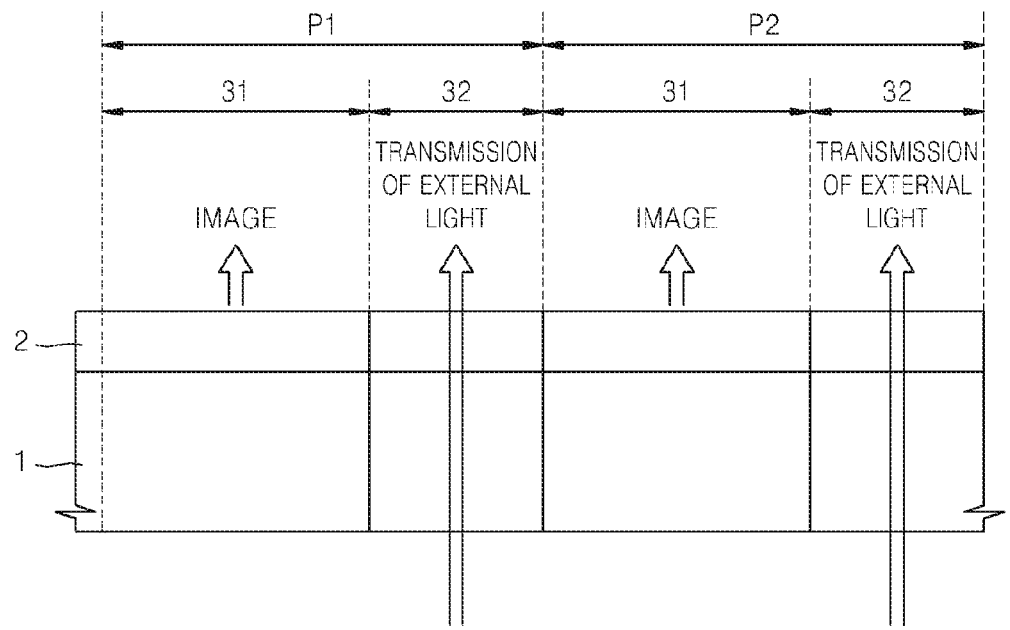
FIG. 1 is a schematic cross-sectional view illustrating an OLED display according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

FIG. 1 is a schematic cross-sectional view illustrating an organic light-emitting diode (OLED) display according to an embodiment.

Referring to FIG. 1, the OLED display includes a display unit 2 formed on a substrate 1.

External light is incident onto the OLED display and can be transmitted through the substrate 1 and the display unit 2.

The display unit 2 is configured to allow external light to be transmitted therethrough as will be described later. As shown in FIG. 1, the display unit 2 is configured to allow a user at a side where an image is formed to see an image below the substrate 1. Although the OLED display of the embodiment of FIG. 1 is a top-emission type display in which the image of the display unit 2 is emitted in a direction away from the substrate 1, the described technology is not limited thereto.

Figure 2:
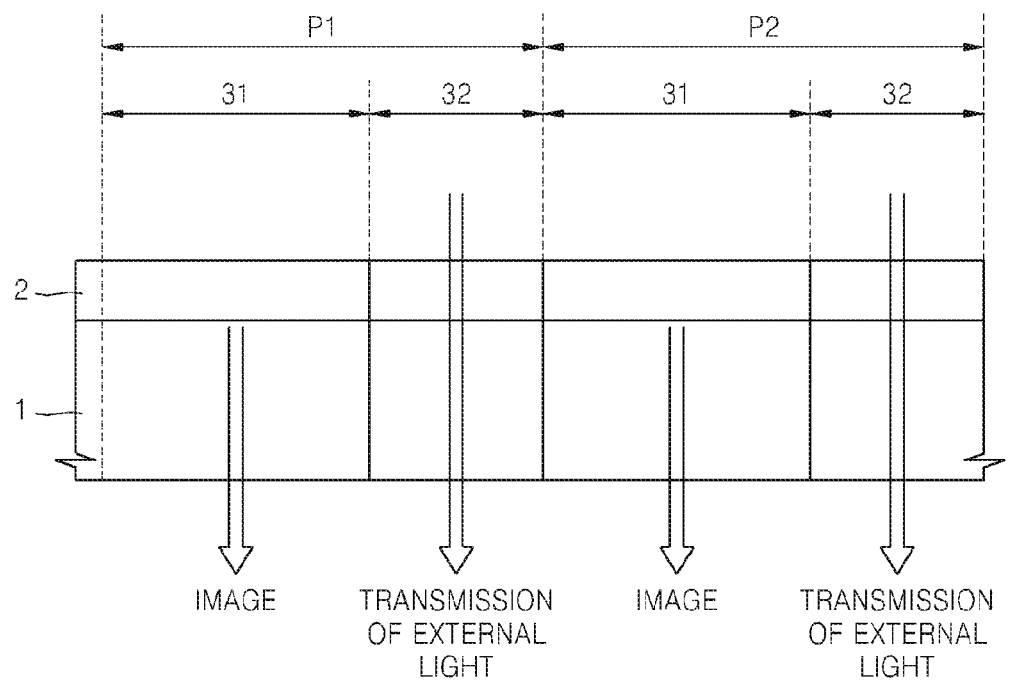
FIGS. 2 and 3 are schematic cross-sectional views illustrating an OLED display according to embodiments.
Figure 3:
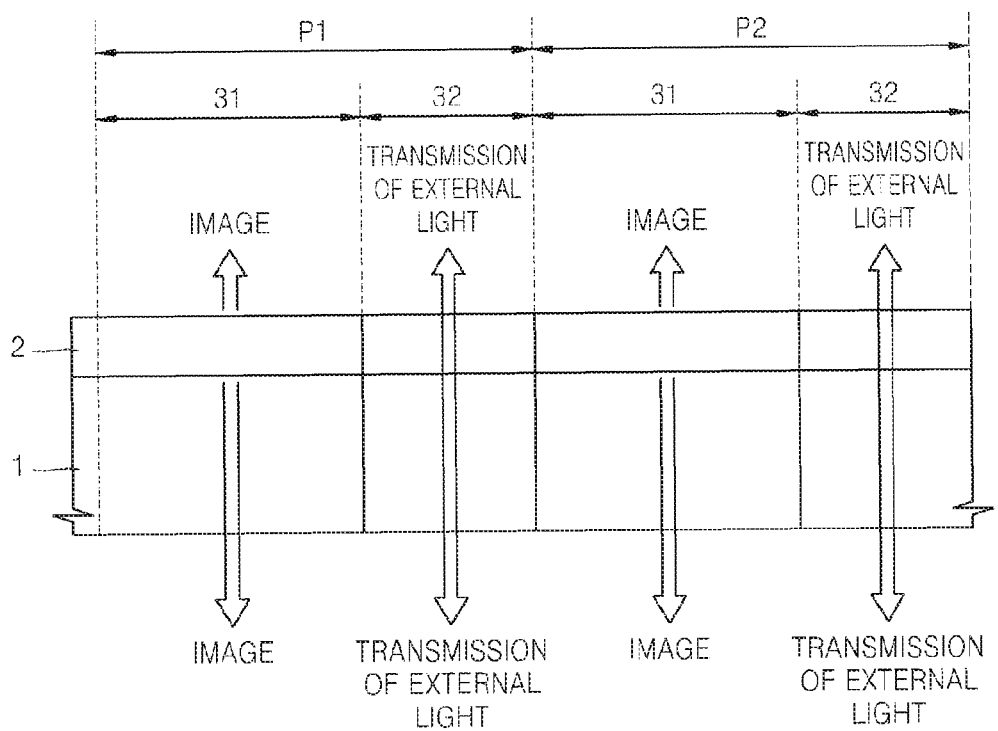

FIGS. 2 and 3 are schematic cross-sectional views illustrating an OLED display according to other embodiments.

As shown in FIG. 2, the OLED display can be embodied as a bottom-emission type display in which an image of the display unit 2 is emitted in the direction of the substrate 1. As shown in FIG. 3, the OLED display can be embodied as a dual emission type display in which the image of the display unit 2 is emitted in the direction of the substrate 1 and in the direction away from the substrate 1.

FIGS. 1 through 3 illustrate a first pixel P1 and a second pixel P2 that are two adjacent pixels of the OLED display. The first and second pixels P1 and P2 respectively include a first area 31 and a second area 32. The image is formed in the first area 31 of the display unit 2. External light is transmitted through the second area 32. That is, each of the first and second pixels P1 and P2 includes both the first area 31 that is used to form the image and the second area 32 through which external light is transmitted so that the environment behind the OLED display can be seen when a user does not look at the image formed on the display unit 2.

In this regard, devices such as a thin film transistor, a capacitor, an OLED, etc. are not formed in the second area 32, which results in the maximization of external light transmission. Due to the enhanced transmissivity of the second area 32, external light through the entire display unit 2 increases, preventing transmitted images from being distorted due to interference of the above described devices.

Figure 4:
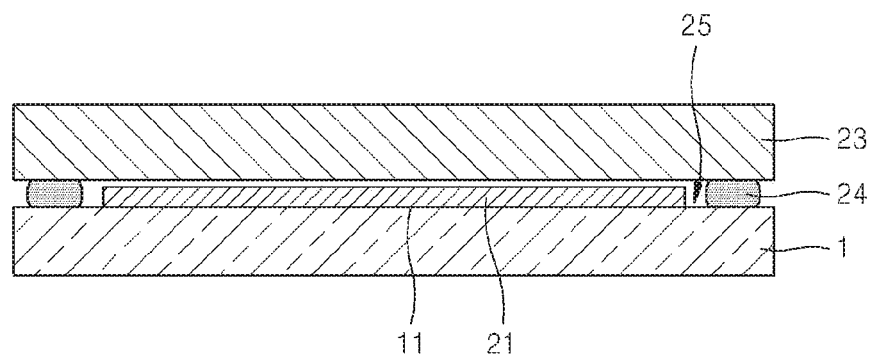
FIG. 4 is a detailed cross-sectional view of one of the OLED displays of FIGS. 1 through 3.

FIG. 4 is a detailed cross-sectional view of one of the OLED displays of FIGS. 1 through 3. Referring to FIG. 4, the display unit 2 includes an organic light-emitting unit 21 formed on a first surface 11 of the substrate 1 and an encapsulation substrate 23 that encapsulates the organic light-emitting unit 21.

The encapsulation substrate 23 is formed of a transparent member so that light emitted from the organic light-emitting unit 21 can be transmitted therethrough. The encapsulation substrate 23 can prevent the penetration of external air or moisture into the organic light-emitting unit 21. Edges of the substrate 1 and the encapsulation substrate 23 are connected to each other via an encapsulation member or sealant 24 so that space 25 between the substrate 1 and the encapsulation substrate 23 is substantially sealed. The space 25 may include a moisture absorbent, a filling material, or the like.

Figure 5:
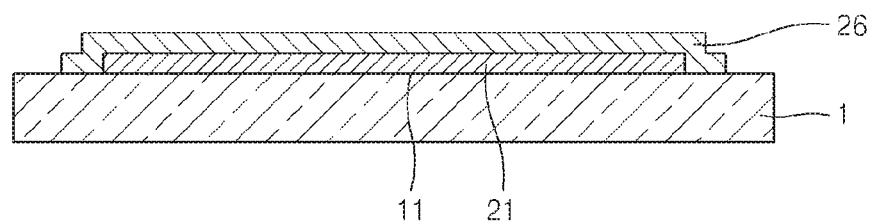
FIG. 5 is a detailed cross-sectional view of the OLED display of FIG. 4 according to another embodiment.

FIG. 5 is a detailed cross-sectional view of the OLED display of FIG. 4 according to another embodiment.

As illustrated in FIG. 5, instead of the encapsulation substrate 23, a thin film encapsulation layer 26 is formed on the organic light-emitting unit 21 to protect the organic light-emitting unit 21 from contaminants contained in the environment. The encapsulation layer 26 may have a structure in which layers formed of an inorganic material such as silicon oxide or silicon nitride and layers formed of an organic material such as epoxy or polyimide are alternately formed. However, the described technology is not limited thereto. Any encapsulation structure can be used for the encapsulation layer 26.

Although not shown, the encapsulation structure of the organic light-emitting unit 21 may further include the encapsulation substrate 23 of FIG. 4 formed over the encapsulation layer 26 of FIG. 5.

Embodiments of the organic light-emitting unit 21 will now be described.

Figure 6:
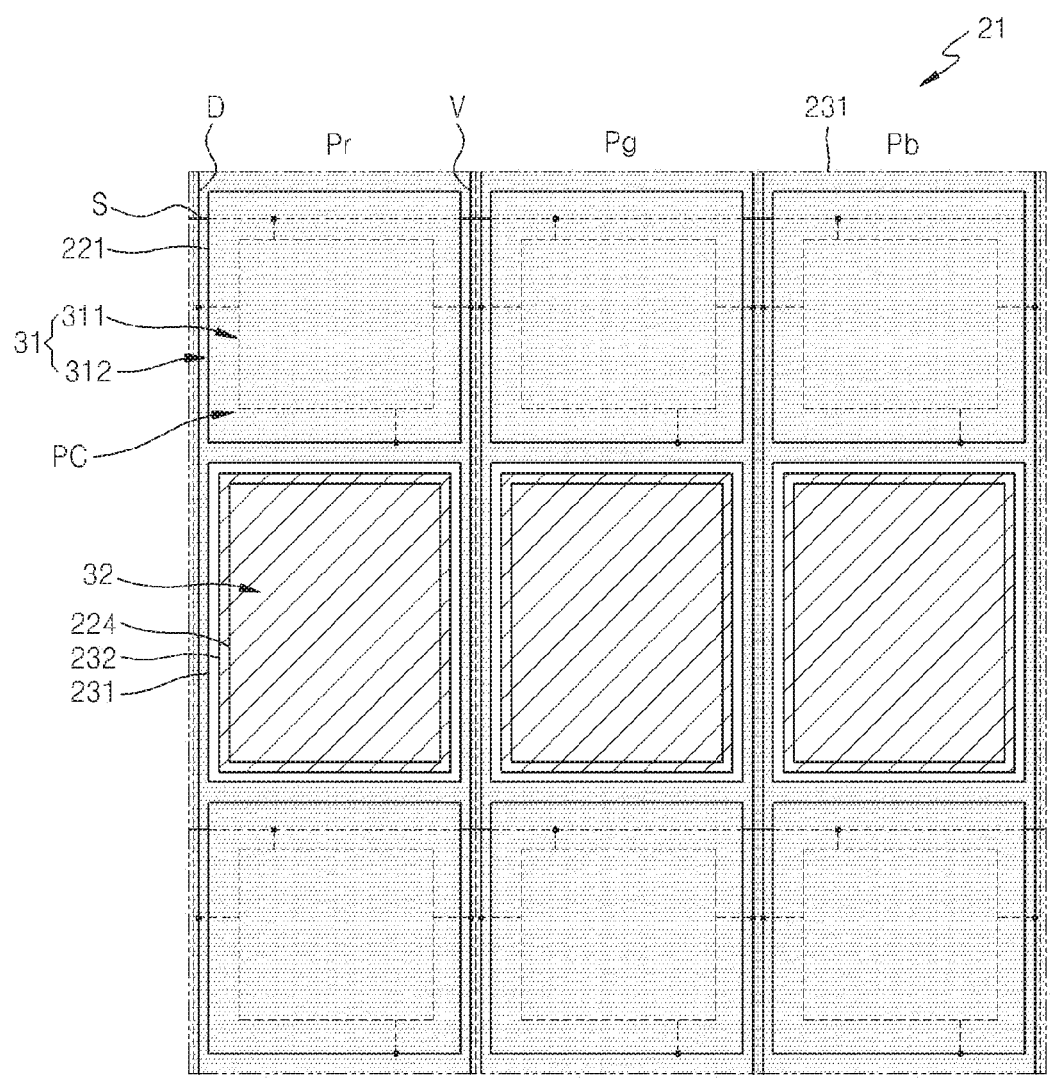
FIG. 6 is a schematic plan view of the organic light-emitting unit of FIG. 4 or 5 according to an embodiment.

FIG. 6 is a schematic view of an embodiment including a red pixel Pr, a green pixel Pg, and a blue pixel Pb of the organic light-emitting unit 21. A circuit area 311 and an emission area 312 are included in the first area 31 of each of the red, green, and blue pixels Pr, Pg, and Pb. According to the embodiment of FIG. 6, the area of the emission area 312 is greater than that of the pixel circuit unit or pixel circuit PC of the circuit area 311 so that the pixel circuit unit PC is entirely hidden by the emission area 312.

The second area 32, through which external light can be transmitted, is adjacent to the first area 31. The second area 32 can be independently provided in each of the red, green, and blue pixels Pr, Pg, and Pb, as shown in FIG. 6.

A plurality of conductive lines such as a scan line S, a data line D, and a power supply line or Vdd line V are electrically connected to the pixel circuit unit PC. Although not shown, various conductive lines may be provided in addition to the scan, data, and Vdd lines S, D, and V according to the configuration of the pixel circuit unit PC.

Figure 7:
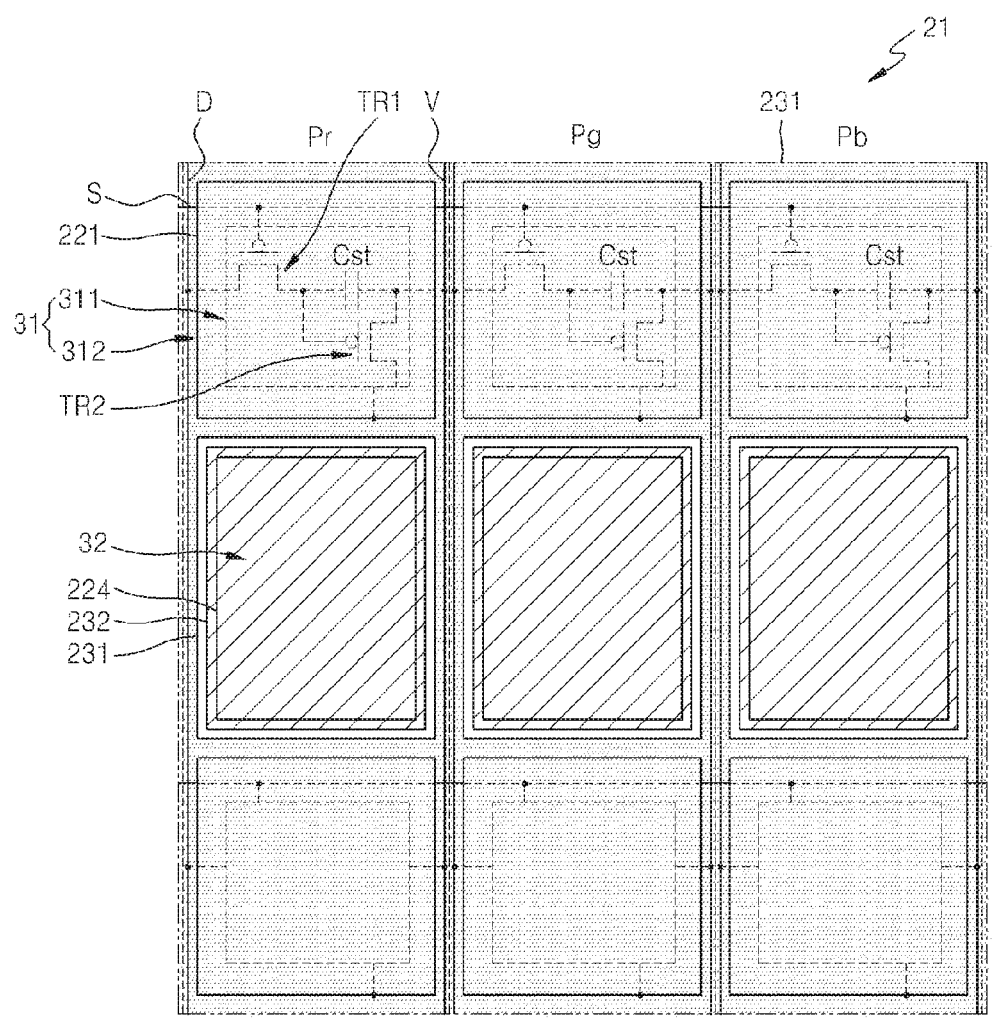
FIG. 7 is a schematic plan view of the organic light-emitting unit of FIG. 6 including an embodiment of the pixel circuit unit.

FIG. 7 is a specific plan view of an embodiment of the pixel circuit unit PC of FIG. 6.

As shown in FIG. 7, the pixel circuit unit PC includes a first thin film transistor TR1 connected to the scan line S and the data line D, a second thin film transistor TR2 connected to the first thin film transistor TR1 and the Vdd line V, and a capacitor Cst connected to the first thin film transistor TR1 and the second film transistor TR2. In this regard, the first thin film transistor TR1 is a switching transistor, and the second film transistor TR2 is a driving transistor. The second thin film transistor TR2 is electrically connected to a first electrode 221. Although the first and second thin film transistors TR1 and TR2 are P-type transistors in the embodiment of FIG. 7, the described technology is not limited thereto. At least one of the first and second thin film transistors TR1 and TR3 may be an N-type transistor. The number of thin film transistors and capacitors is not limited to those in the illustrated embodiment. Thus, at least two thin film transistors and at least one capacitor may be combined in the pixel circuit unit PC.

Referring to the embodiment of FIG. 7, the scan line S overlaps the first electrode 221. However, the described technology is not necessarily limited thereto. At least one of the conductive lines, including the scan line S, the data line D, and the Vdd line V, may be formed to overlap the first electrode 221. Depending on the embodiment, all of the conductive lines, including the scan line S, the data line D, and the Vdd line V, may be formed to overlap the first electrode 221 or may be formed adjacent to the first electrode 221.

Due to the separation of the first area 31 and the second area 32, external images can be prevented from being distorted when transmitted through the second area 32. Specifically, the scattering of external light on the patterns of devices included in the pixel circuit unit PC can be prevented.

The first and second areas 31 and 32 are formed such that the ratio of the total area of the first area 31 and the second area 32 to the area of the second area 32 is within the range of about 5% to about 90%.

If the ratio of the combined areas of the first and second areas 31 and 32 to the area of the second area 32 is less than about 5%, when the display unit 2 of FIG. 1 is switched off, the intensity of light transmitted through the display unit 2 is low, and thus, a user has difficulty seeing an object or an image located on the opposite side of the display unit 2. That is, the display unit 2 is not transparent. Although the area of the second area 32 is about 5% of the total area of the first and second areas 31 and 32, the first area 31 is formed to be an island with respect to the second area 32, and all available conductive patterns are formed in the first area 31, which minimizes scattering of external light, and thus, the user may recognize the display unit 2 as a transparent display. When a thin film transistor included in the pixel circuit unit PC is formed as a transparent thin film transistor such as an oxide semiconductor, and an OLED is formed as a transparent device, the user may further recognize the display unit 2 as a transparent display.

If the ratio of the total area of the first and second areas 31 and 32 with to the area of the second area 32 is greater than about 90%, the pixel integration of the display unit 2 is extremely low, it is difficult to stably form an image by emitting light in the first area 31. That is, the smaller the area of the first area 31, the higher the brightness of light required to be emitted from an organic layer 223, as described later, so as to form the image. As described above, if the OLED operates in a high-brightness state, there is a problem that the lifespan of the OLED rapidly declines. If the ratio of the total area of the first and second area 31 and 32 to the area of the second area 32 is greater than about 90% while maintaining an appropriate size of the single first area 31, there is a problem that the overall size of the pixel is increased, leading to a low resolution.

However, depending on the embodiment, the ratio of the combined first and second areas 31 and 32 to the second area 32 can be less than about 5% or greater than about 90%.

The ratio of the total area of the first and second areas 31 and 32 to the area of the second area 32 may be within a range of about 20% to about 70%.

The area of the first area 31 is considerable greater than that of the second area 32 when the ratio of the total area of the first and second areas 31 and 32 to the area of the second area 32 is equal to or less than about 20%, and thus, there is a limit to the brightness of the external image the user sees via the second area 32. When the ratio of the total area of the first and second areas 31 and 32 to the area of the second area 32 is equal to or greater than about 70%, there are many limitations in designing the pixel circuit unit PC that is to be formed in the first area 31.

The first electrode 221 is electrically connected to the pixel circuit unit PC and is formed in the first area 31. The pixel circuit unit PC overlaps the first electrode 221 to hide the pixel circuit unit PC. At least one of the conductive lines, including the scan line S, the data line D, and the Vdd line V, may be formed across the first electrode 221. In some embodiments, the conductive lines are unlikely to negatively affect transmissivity compared to the pixel circuit unit PC, and thus, the conductive lines may be formed adjacent to the first electrode 221 based on the design requirements. The first electrode 221 includes a reflective layer formed of conductive metal that can reflect light as described later, and thus, the overlapped pixel circuit unit PC is hidden and the external image is prevented from being distorted due to the pixel circuit unit PC in the first area 31.

Referring to FIGS. 6 and 7, according to an embodiment, a refractive auxiliary layer 231 is formed in first area 31 and a reflective prevention layer or reflection prevention layer 232 is formed in the second area 32, thereby increasing light extraction efficiency of the OLED and the transmissivity of external light.

Figure 8:
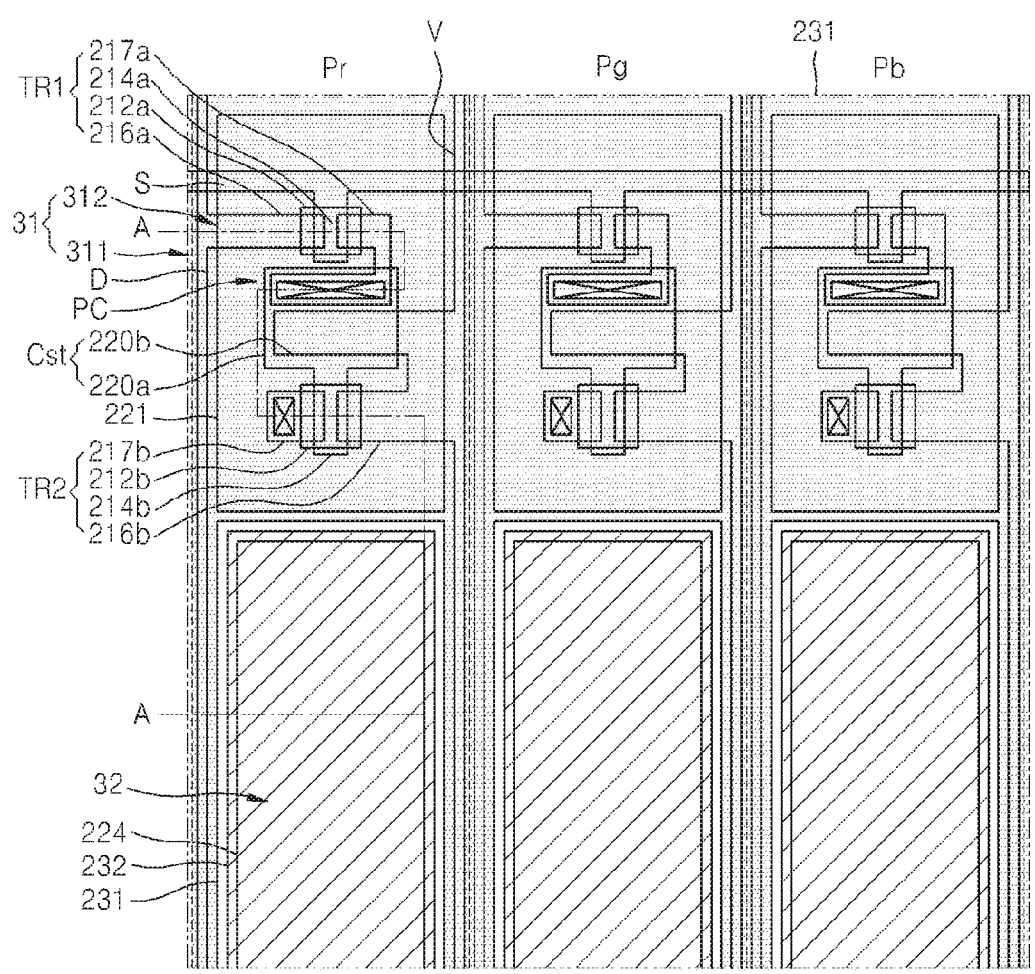
FIG. 8 is a specific plan view of the pixel circuit unit of FIG. 7.
Figure 9:
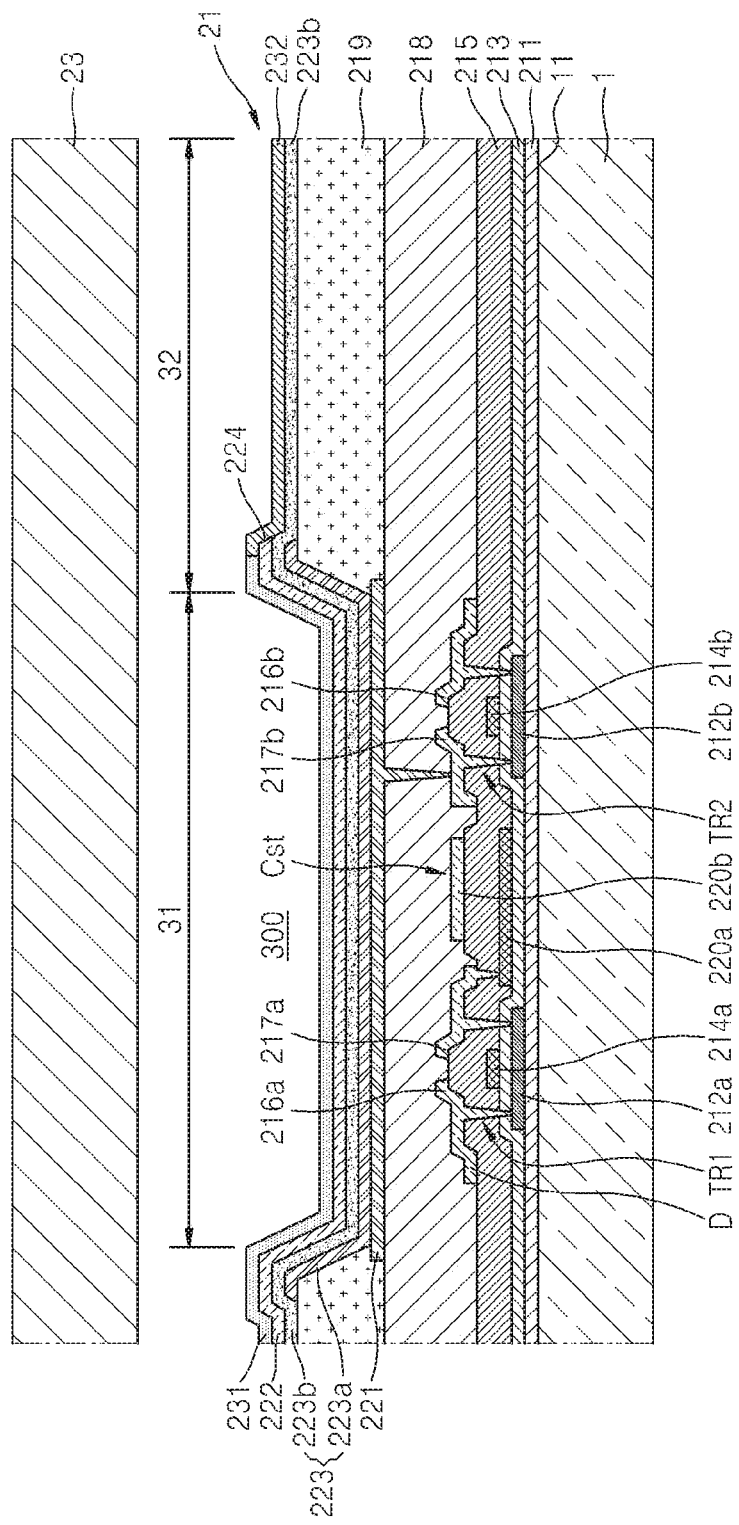
FIG. 9 is a cross-sectional view taken along line A-A of FIG. 8.

FIG. 8 is a detailed plan view of the organic light-emitting unit 21, according to an embodiment in which the pixel circuit unit PC of FIG. 7 is implemented. FIG. 9 is a cross-sectional view taken along line A-A of FIG. 8.

According to the embodiment of FIGS. 8 and 9, a buffer layer 211 is formed on the first surface 11 of the substrate 1, and the first thin film transistor TR1, the capacitor Cst, and the second thin film transistor TR2 are formed on the buffer layer 211.

The buffer layer 211 is formed of a transparent insulating material, can prevent the penetration of contaminants, and planarizes the first surface 11 of the substrate 1. Thus, the buffer layer 211 may be formed of various materials that are capable of performing these functions. For example, the buffer layer 211 may be formed of an inorganic material such as silicon oxide, silicon nitride, silicon oxynitride, aluminum oxide, aluminum nitride, titanium oxide, or titanium nitride; an organic material such as polyimide, polyester, or acryl; or a stack structure including the inorganic and organic materials. The buffer layer 211 is not an essential element and may be omitted according to necessity.

A first semiconductor active layer 212a and a second semiconductor active layer 212b are formed on the buffer layer 211.

The first and second semiconductor active layers 212a and 212b may be formed of polycrystalline silicon, but are not limited thereto, and may also be formed of an oxide semiconductor. For example, the first and second semiconductor active layers 212a and 212b may be an I-G-Z-O layer [$(In_2O_3)a(Ga_2O_3)b(ZnO)c$ layer](where a, b, and c are real numbers that respectively satisfy the conditions of $a \geq 0$, $b \geq 0$, and $c > 0$).

A gate insulating layer 213 is formed on the buffer layer 211 to cover the first and second semiconductor active layers 212a and 212b, and a first gate electrode 214a and a second gate electrode 214b are formed on the gate insulating layer 213.

An interlayer insulating layer 215 is formed on the gate insulating layer 213 to cover the first and second gate electrodes 214a and 214b. A first source electrode 216a, a first drain electrode 217a, a second source electrode 216b, and a second drain electrode 217b are formed on the interlayer insulating layer 215 so that the first source and drain electrodes 216a and 217a and the second source and drain electrodes 216b and 217b respectively contact the first semiconductor active layer 212a and the second semiconductor active layer 212b through contact holes.

The scan line S may be formed simultaneously with the formation of the first and second gate electrodes 214a and 214b. The data line D may be formed simultaneously with the formation of the first source electrode 216a so that the data line D is connected to the first source electrode 216a. The Vdd line V may be formed simultaneously with the formation of the second source electrode 216b so that the Vdd line V may be connected to the second source electrode 216b.

A lower electrode 220a of the capacitor Cst may be formed simultaneously with the formation of the first and second gate electrodes 214a and 214b. An upper electrode 220b of the capacitor Cst may be formed simultaneously with the formation of the first drain electrode 217a.

The structures of the first and second thin film transistors TR1 and TR2 and the capacitor Cst are not limited to the above description, and various structures of thin film transistors and capacitor can be applied. For example, though the first and second thin film transistors TR1 and TR2 are illustrated and described as having a top gate structure, they may also have a bottom gate structure in which the first and second gate electrodes 214a and 214b are respectively formed below the first and second semiconductor active layers 212a and 212b.

A passivation layer 218 is formed to cover the first thin film transistor TR1, the capacitor Cst, and the second thin film transistor TR2. The passivation layer 218 may be an electrically insulating layer including a single layer or a plurality of layers that have a planarized upper surface. The passivation layer 218 may be formed by using an inorganic material and/or an organic material.

As shown in the embodiments of FIGS. 8 and 9, the first electrode 221 is formed on the passivation layer 218 to hide the first thin film transistor TR1, the capacitor Cst, and the second thin film transistor TR2. The first electrode 221 is electrically connected to the second drain electrode 217b of the second thin film transistor TR2 through via hole formed in the passivation layer 218. The first electrode 221 may be formed in the form of an island in each pixel, as shown in FIG. 6.

A pixel-defining layer 219 is formed on the passivation layer 109 to cover an edge of the first electrode 221.

The organic layer 223 is formed on the first electrode 221. The organic layer 223 includes an emission layer (EML) 223a that emits red, green, or blue light and a common layer 223b having a monolayer or multilayer structure that enables the EML 223a to easily emit light. The common layer 223b may include at least one of a hole injection layer (HIL), a hole transport layer (HTL), an electron transport layer (ETL), and an electron injection layer (EIL). For example, the organic layer 223 may have a structure in which the HIL, the HTL, the EML 223a, the ETL, and the EIL are sequentially stacked on the first electrode 221.

The EML 223a is provided only in the first area 31. That is, the EML 223a may be formed by patterning the EML layer 223a on the first electrode 221 of each of the red, green, and blue pixels. The EML 223a may include a host material and a dopant material.

The host material may include tris(8-hydroxy-quinolinato)aluminum (Alq3), 9,10-di(naphth-2-yl)anthracene (ADN), 2-Tert-butyl-9,10-di(naphth-2-yl)anthracene (TBADN), 4,4'-bis(2,2-diphenyl-ethene-1-yl)biphenyl (DPVBi), or 4,4'-bis(2,2-di(4-methylphenyl)-ethene-1-yl) biphenyl (p-DMDPVBi).

The dopant material may include DPAVBi (4,4'-bis[4-(di-p-tolylamino)styril]biphenyl), ADN (9,10-di(naph-2-tyl)anthracene), or TBADN (2-tert-butyl-9,10-di(naphth-2-yl)anthracene).

The common layer 223b may be formed commonly over all pixels. Thus, the common layer 223b may be provided in the second area 32 of each pixel in addition to the first area 31 of each pixel.

The HIL may include a phthalocyanine compound such as copper phthalocyanine or a Starbust type amine such as TCTA, m-MTDATA, or m-MTDAPB.

The HTL may include N,N'-bis(3-methylphenyl)-N,N'-diphenyl-[1,1-biphenyl]-4,4'-diamine (TPD), or N,N'-di(naphthalene-1-yl)-N,N'-diphenyl benzidine (α-NPD).

The ETL may include quinoline derivatives, in particular, tris(8-quinolinolato) aluminum, 3-(4-biphenylyl)-4-phenyl-5-(4-tert-butyl phenyl)-1,2,4-triazole (TAZ), Balq, and beryllium bis(benzoquinolin-10-olate: Bebq2).

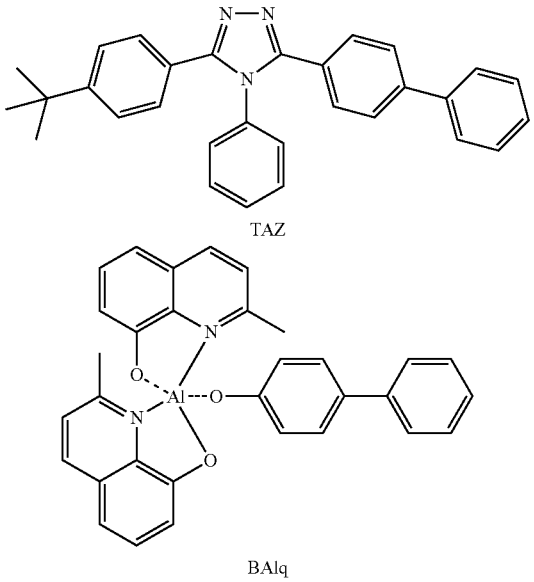

TAZ

BAlq

The EIL may include NaCl, CsF, Li$_2$O, or BaO.

In addition, the materials of, in particular, the ETL or the EIL included in the common layer 223b are mostly highly refractive materials having a refractive index equal to or higher than about 1.8. However, depending on the embodiment, the refractive index of the ETL or the EIL included in the common layer 223b can be less than about 1.8.

The second electrode 222 is provided on the organic layer 223. The second electrode 223 is formed over the first area 31 and the second area 32.

The first electrode 221 may function as an anode electrode and the second electrode 222 may function as a cathode electrode. However, the polarities of the first and second electrodes 221 and 222 may also be exchanged.

The first electrode 221 may be formed to have a size corresponding to the first area 31 in each pixel. The second electrode 222 may be formed as a common electrode to cover all pixels of the organic light-emitting unit 21.

According to an embodiment, the first electrode 221 is a reflective electrode and the second electrode 222 is a transparent electrode. Thus, in this embodiment, the organic light-emitting unit 21 is a top emission type display in which light is emitted in the direction of the second electrode 222.

To this end, the first electrode 221 may include a reflective layer formed of Ag, Mg, Al, Pt, Pd, Au, Ni, Nd, Ir, Cr, Li, or Ca or a compound of these and may include ITO, IZO, ZnO, or In$_2$O$_3$ which has a high work function. The second electrode 222 may be formed of Ag, Mg, Al, Pt, Pd, Au, Ni, Nd, Jr, Cr, Li, or Ca which has a low work function or a compound of these. For example, the second electrode 222 may be formed of a Mg:Ag thin film. The second electrode 222 may be formed of a thin film to increase transmissivity.

When the first electrode 221 is provided as the reflective electrode as described above, the pixel circuit unit PC formed below the first electrode 221 is hidden by the first electrode 221, and thus, as shown in FIG. 8, a user above the second electrode 222 cannot see the patterns of the first thin film transistor TR1, the capacitor Cst, and the second thin film transistor TR2 that are formed below the first electrode 221. The user also cannot see the portions of the scan line S, the data line D, and the Vdd line V below the first electrode 221.

When the first electrode 221 is provided as the reflective electrode, light is emitted to a viewer, i.e. in the upward direction, thereby reducing the amount of light that is lost in the direction opposite to the viewer. As described above, the first electrode 221 functions to conceal the various patterns of the pixel circuit formed below the first electrode 221, and thus, the viewer may see a clearer transmission image.

The passivation layer 218, the gate insulating layer 213, the interlayer insulating layer 215, and the pixel-defining layer 219 may be formed as transparent insulating layers.

In addition, a first transmission window or first transmission opening 224 is provided on the second electrode 222 in the second area 32. The first transmission window 224 may be formed by removing a portion of the second electrode 222 corresponding to the second area 32. The first transmission window 224 may be formed in an island pattern. As shown in FIG. 8, the first transmission window 224 may be independently provided in each of the pixels Pr, Pg, and Pb.

Figure 10:
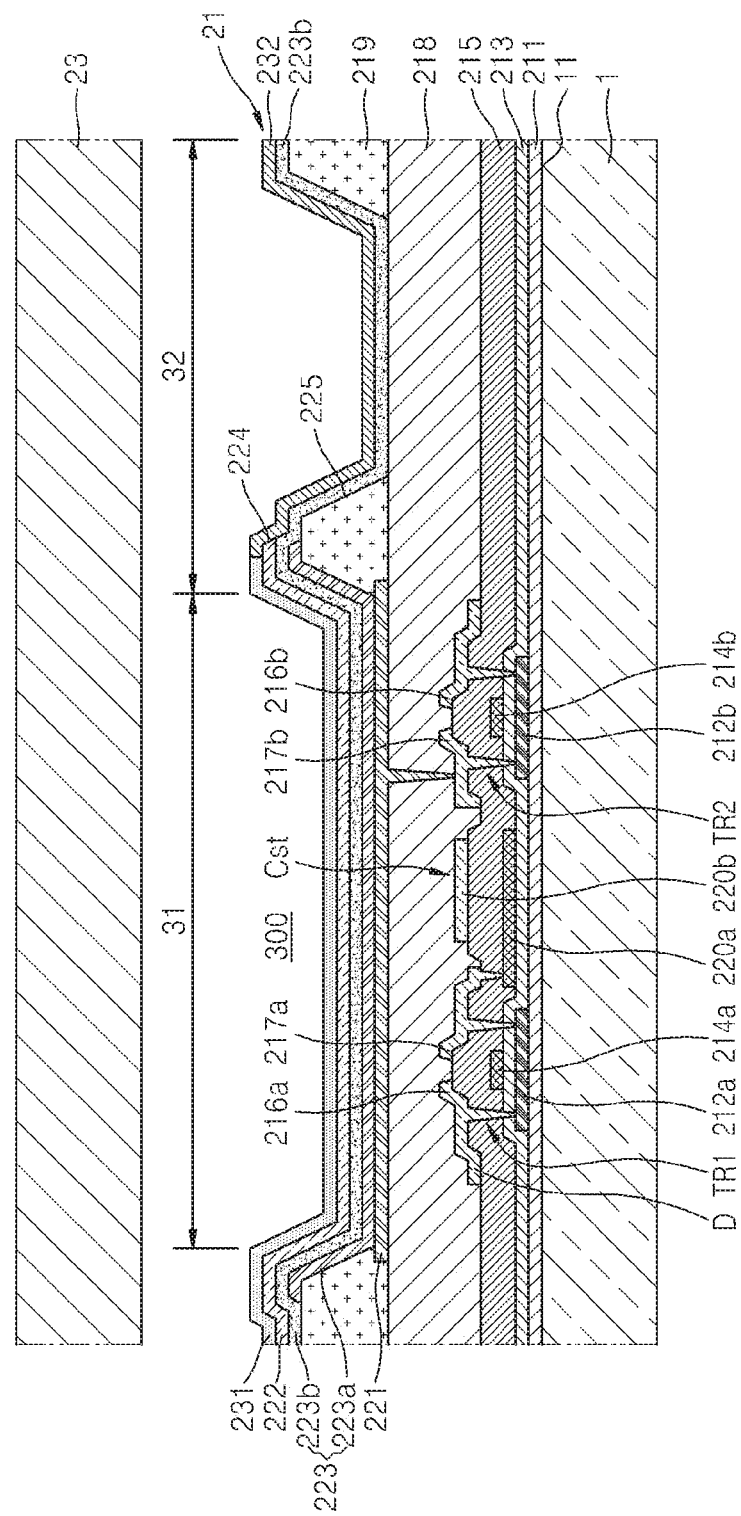
FIGS. 10 through 12 are cross-sectional views of other embodiments taken along line A-A of FIG. 8.

FIG. 10 illustrates another embodiment in which a second transmission window or second transmission opening 225 is further formed in the pixel-defining layer 219. The second transmission window 225 may be formed by removing a portion of the pixel-defining layer 219 corresponding to the second area 32. The second transmission window 225 may be formed to overlap the first transmission window 224. The second transmission window 225 may be formed in an island pattern. As shown in FIG. 8, the second transmission window 225 may be independently provided in each of the pixels Pr, Pg, and Pb. Although not shown in FIG. 10, the second transmission window 225 may be further formed in at least one of the passivation layer 218, the interlayer insulating layer 215, the gate insulating layer 213, and the buffer layer 211.

According to an embodiment, the first transmission window 224 is formed in the second electrode 222 included in the second area 32, thereby preventing external light from being reflected by the second electrode 222 which may be formed of metal. As described above, the reflectivity of external light is reduced, thereby further increasing the transmissivity of external light in the second area 32.

In addition, a refractive auxiliary layer 231 is provided on a portion of the second electrode 222 corresponding to the first area 31. The refractive auxiliary layer 231 is patterned and formed in only the first area 31 and is not formed in the second area 32. The refractive auxiliary layer 231 increases the extraction rate of light emitted by the EML 223a to improve light extraction efficiency and simultaneously protect the OLED.

The light emitted by the EML 223a is emitted in all directions. The light is partly reflected by the first electrode 221, that is the reflective electrode, and travels in the direction of the second electrode 222. The second electrode 222 is a semi-transmission electrode including a thin film metal layer. The light is partially reflected from the second electrode 222 to the first electrode 221. As such, the first electrode 221 and the second electrode 222 form a microcavity. The resonance distance may be adjusted by adjusting the distance between the first electrode 221 and the second electrode 222, thereby emitting light of a desired wavelength to the environment. In addition, an air layer 300 having a refractive index of 1 is present between the OLED and the encapsulation substrate 23. The greater the refractive index of the interface between the OLED and the air layer 300, the higher the probability that the light emitted by the EML 223a is reflected from the interface back to the first electrode 221. The refractive auxiliary layer 231 having a high refractive index is formed on the second electrode 222, and thus, the resonance of the light emitted by the EML 223a can be enhanced, thereby improving the light extraction efficiency of the OLED.

To increase light extraction efficiency, the refractive auxiliary layer 231 is formed of a material having a higher refractive index than that of the organic layer 223. For example, the refractive auxiliary layer 231 may be formed of a material having a refractive index equal to or higher than about 1.8. For example, the refractive auxiliary layer 231 may be formed of 8-quinolionlato lithium. However, this is an example, and the refractive auxiliary layer 231 may be formed of poly (3,4-ethylenedioxythiophene) (poly (3,4-ethylenedioxythiophene), PEDOT), 4,4'-bis [N-(3 -methylphenyl)-N-phenylamino] biphenyl (TPD), 4,4', 4"-tris [(3-methylphenyl) phenylamino] triphenylamine (m-MTDATA), 1,3,5-tris [N,N-bis (2-methylphenyl)-amino]-benzene (o-MTDAB), 1,3,5-tris [N,N-bis (3-methylphenyl)-amino]-benzene (m-MTDAB), 1,3,5-tris [N,N-bis (4-methylphenyl)-amino]-benzene (p-MTDAB), 4,4'-bis [N,N-bis (3-methylphenyl)-amino]-diphenylmethane (BPPM), 4,4'-di Yerba imidazolyl-1,1'-biphenyl (CBP), 4,4', 4"-tris (N-carbazole) triphenyl amine (TCTA), 2,2',2"-(1,3, 3.5-benzene-tolyl) tris-[1-phenyl-1H-benzoimidazole] (TPBI), or 3-(4-biphenyl)-4-phenyl-5-t-butylphenyl-1,2,4-triazole sol (TAZ).

In addition, the reflective prevention layer 232 is provided on a portion of the common layer 223b corresponding to the second area 32. The reflective prevention layer 232 is patterned and formed only in the second area 32 and is not formed in the first area 31. The reflective prevention layer 232 reduces the reflectivity of external light, thereby improving the transmissivity of light in the second area 32.

External light transmitted through the encapsulation substrate 23 is reflected at the interface between a layer formed on the outermost edge of the second area 32 and the air layer 300. Although a reflective prevention film is formed on an outer surface of the encapsulation substrate 23, the reflective prevention film may reduce interface reflection between the encapsulation substrate 23 and the air layer 300 and does not reduce interface reflection between the layer formed on the outermost edge of the second area 32 and the air layer 300. According to an embodiment, the second electrode 222 is not provided in area corresponding to the second area 32, and thus, the reflection of external light by metal is removed. However, the common layer 223b is formed on an uppermost insulating layer corresponding to the second area 32. The refractive indexes of various materials forming the common layer 223b are greatly different from that of the air layer 300 having an average refractive index of 1, and thus, the reflectivity of the common layer 223b is considerably high. However, when the reflective prevention layer 232 having a lower refractive index than that of the common layer 223b is formed on the common layer 223b, the difference in the refractive index between the reflective prevention layer 232 and the air layer 300 can be reduced, thereby reducing the interface reflection.

The reflective prevention layer 232 may be formed of a material having a lower refractive index than that of the organic layer 223. For example, the reflective prevention layer 232 may be formed of a material having a refractive index equal to or less than about 1.8. However, the reflective prevention layer 232 may be formed of material having a refractive index of greater than about 1.8. For example, the reflective prevention layer 232 may be formed of 8-hydroxyquinolatolithum (Liq).

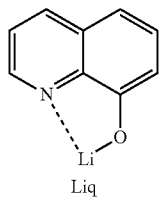

Liq

In this regard, LiF has a refractive index in the range of about 1.3 to about 1.4, and Liq has a refractive index of about 1.6.

Figure 11:
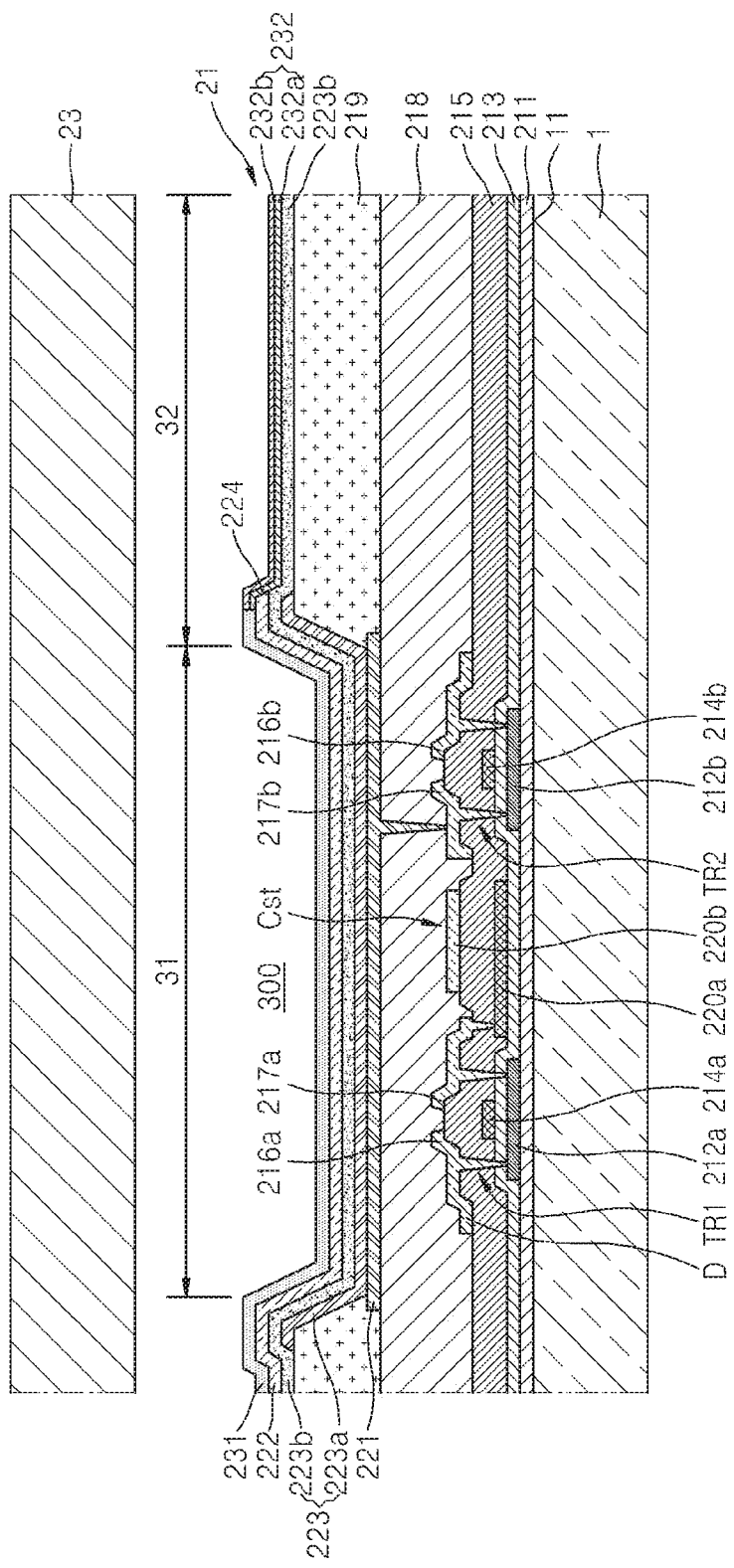

According to another embodiment, the reflective prevention layer 232 may include a plurality of layers, as shown in FIG. 11. For example, the first layer 232a may be formed on the organic layer 223 and the second layer 232b may be formed on the first layer 232a and contact the air layer 300. In this embodiment, the second layer 232b includes a material having a lower refractive index than that of the first layer 232a. For example, the first layer 232a may be formed of Liq and the second layer 232b may be formed of LiF.

The reflective prevention layer 232 includes the plurality of layers having different refractive indexes as described above, and thus, the difference in the refractive index between the organic layer 223 and the air layer 300 can be quantitatively reduced. The reflective prevention layer 232 reduces the difference between refractive indexes at the interface, which may further reduce the interface reflection between the organic layer 223 and the air layer 300, and may improve the transmissivity of light in the second area 32.

TABLE 1

| Classification | | Transmissivity % | Reflectivity (%) | Absorptance (%) |
|---|---|---|---|---|
| Comparative example 1 | Organic layer/second electrode/refractive auxiliary layer | 86.8 | 7.1 | 6.1 |
| Comparative example 2 | Organic layer/refractive auxiliary layer | 86.2 | 13.6 | 0.2 |
| Embodiment 1 | Organic layer/reflection prevention layer (FIG. 11) | 93.1 | 6.7 | 0.2 |

Table 1 above is a simulation result obtained by the effect of transmissivity of embodiment 1. In contrast to the comparative examples 1 and 2 including the refractive auxiliary layer 231, in embodiment 1 including the reflective prevention layer 232 having the structure of FIG. 11, the transmissivity of external light increases to higher than about 90% and the reflectivity of external light dramatically decreases.

Although the reflective prevention layer 232 includes two layers, namely, the first and second layers 223a and 223b in FIG. 11, this is an example, and the reflective prevention layer 232 may have a stack structure of three or more layers.

Figure 12:
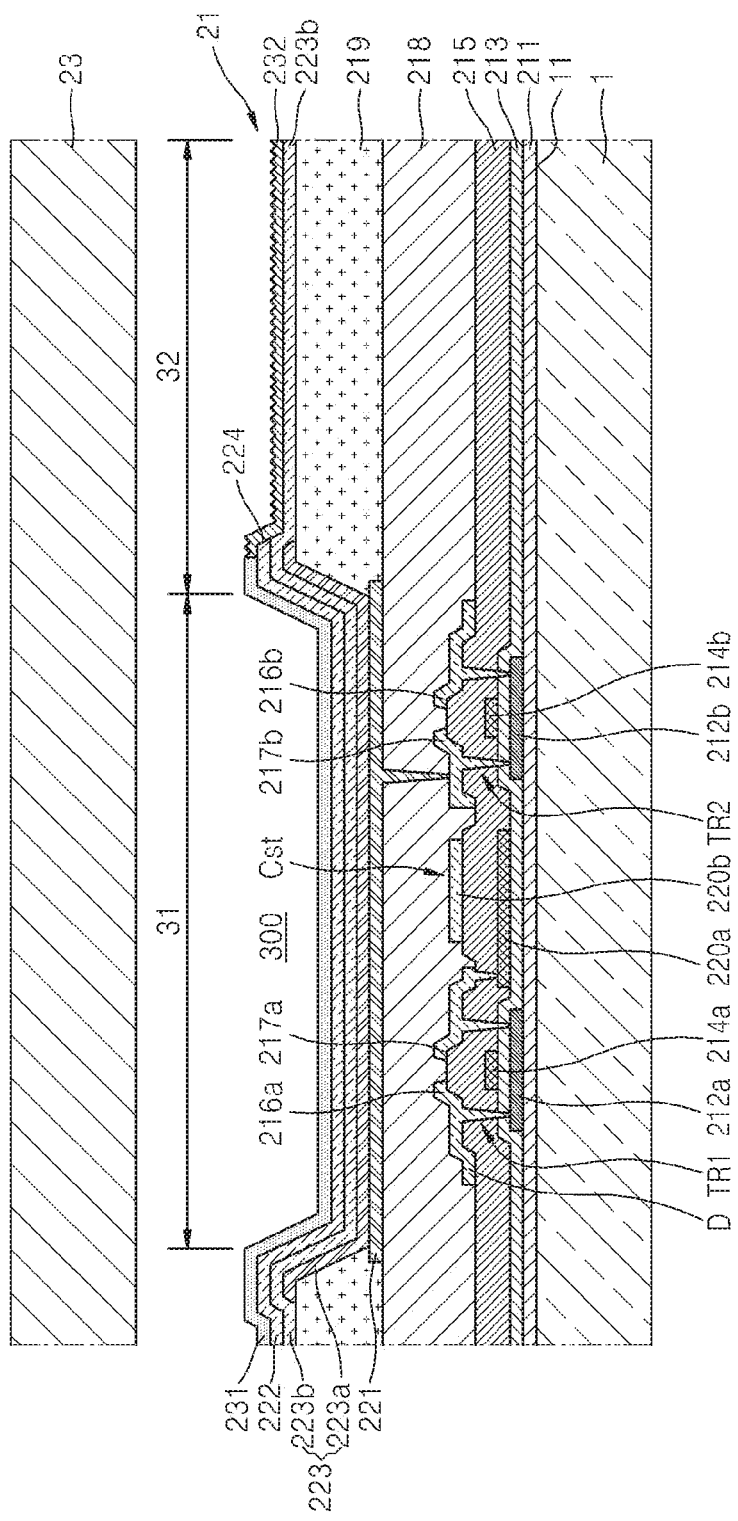

FIG. 12 illustrates another embodiment that is similar to the embodiment of FIG. 9 and includes irregularities on the surface of the reflective prevention layer 232. The irregularities are substantially uniformly provided and have a nano-size. Accordingly, in the embodiment of FIG. 12 the surface of the reflective prevention layer 232 is uneven. Although not shown, another embodiment is similar to the embodiment of FIG. 11 and includes irregularities on the surface of the reflective prevention layer 232. The irregularities formed in the reflective prevention layer 232 scatter external light, and thus, the reflectivity of external light is reduced. Although not shown, another embodiment includes irregularities on the surface of the reflective prevention layer 232 and is formed of the same material as that of the refractive auxiliary layer 231. In this embodiment, the irregularities formed in the reflective prevention layer 232 scatter external light, and thus, the reflectivity of external light is reduced.

Figure 13:
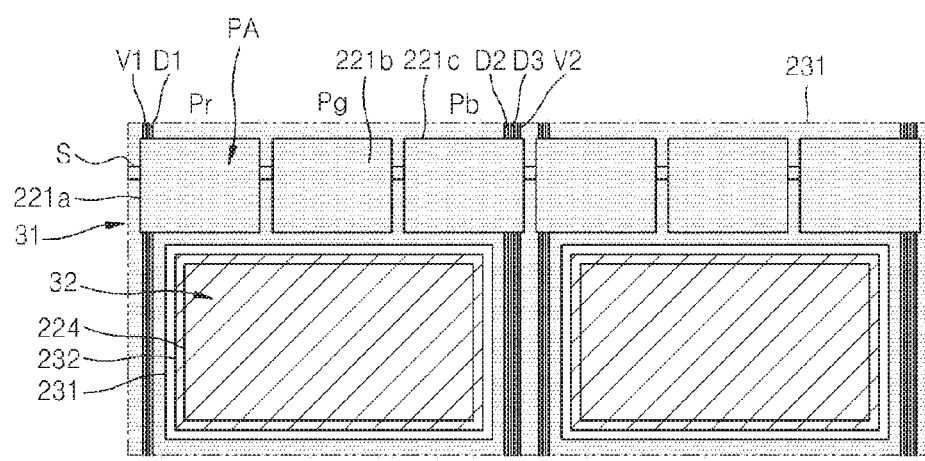
FIG. 13 is a schematic plan view of the organic light-emitting unit of FIG. 4 or 5 according to another embodiment.

FIG. 13 is a schematic plan view of the organic light-emitting unit 21 according to another embodiment. A single second area 32 is formed corresponding to the first electrodes 221a, 221b, and 221b of the respective red, green, and, blue pixels Pr. A first data line D1 through a third data line D3 are respectively electrically connected to the first electrodes 221a, 221b, and 221c of the red, green, and blue pixels Pr, Pg, and Pb. A first Vdd line V1 is electrically connected to the first electrodes 221a and 221b of the red and green pixels Pr and Pg. A second Vdd line V2 is electrically connected to the first electrode 221c of the blue pixel Pb.

Such a structure includes a single large second area 32 with respect to three pixels, for example, red R, green G, and blue B, thereby further increasing transmissivity and further reducing distortion of an image due to scattering of the light. The first transmission window 224 is formed in a position of the second electrode 222 corresponding to the second area 32, thereby further improving transmissivity.

Meanwhile, the refractive auxiliary layer 231 is provided in the first area 31 and the reflective prevention layer 232 is provided in the second area 32, thereby improving the light extraction efficiency of the OLEDs and increasing the transmissivity of external light.

As described above, according to at least one embodiment, the transmissivity of external light in an OLED display can be improved.

It should be understood that the exemplary embodiments described herein should be considered in a descriptive sense only and not for purposes of limitation. Descriptions of features or aspects within each embodiment should typically be considered as available for other similar features or aspects in other embodiments.

While the inventive technology has been described with reference to the figures, it will be understood by those of ordinary skill in the art that various changes in form and details may be made therein without departing from the spirit and scope of the present invention as defined by the following claims.

What is claimed is:

1. An organic light-emitting diode (OLED) display, comprising:
    a plurality of pixels, wherein each pixel includes:
        a first area configured to emit light and a second area configured to transmit external light therethrough;
        a thin film transistor disposed in the first area;
        a first electrode disposed in the first area and electrically connected to the thin film transistor;
        an organic emission layer disposed on the first electrode in the first area;
        a second electrode covering at least the organic emission layer, wherein the second electrode is shared by all of the pixels;
    a first capping structure substantially covering the second electrode; and
    a second capping structure in the second area, wherein the second capping structure has a first layer and a second layer disposed directly on the first layer and having a lower refractive index than that of the first layer.

2. The OLED display of claim 1, wherein the first layer of the second capping structure has a lower refractive index than that of the first capping structure.

3. The OLED display of claim 1, wherein an upper surface of the second capping layer is uneven.

4. The OLED display of claim 1, wherein the first layer includes Liq and the second layer includes LiF.

5. The OLED display of claim 1, wherein the first capping layer includes 8-quinolionlato lithium.

6. The OLED display of claim 1, further comprising a common layer including at least one of a hole injection layer, a hole transport layer, an electron transport layer, and an electron injection layer, wherein the common layer is disposed between the first electrode and the second electrode in the first area and in the second area.

7. The OLED display of claim 6, wherein the second electrode has a first opening in the second area and wherein at least a portion of the common layer disposed in the second area is exposed by the first opening.

8. The OLED display of claim 7, further comprising at least one insulating layer covering the thin film transistor, wherein the insulating layer of the pixel includes a second opening and wherein the second opening at least partially overlaps the first opening.

9. The OLED display of claim 8, wherein the first area of the pixel comprises: i) a circuit area in which the thin film transistor is disposed and ii) an emission area in which the first electrode is disposed, and wherein the circuit area and the emission area at least partially overlap each other.

10. The OLED display of claim 1, wherein the first electrode is configured to reflect light.

11. The OLED display of claim 7, wherein each of the first openings is disposed only in the respective pixel.

12. The OLED display of claim 7, wherein each of the first openings is shared between at least two adjacent pixels.

13. An organic light-emitting diode (OLED) display, comprising:
a plurality of pixels, wherein each pixel includes:
a first area configured to emit light and a second area configured to transmit external light therethrough;
a thin film transistor disposed in the first area;
a first electrode disposed in the first area and electrically connected to the thin film transistor;
an organic layer including an organic emission layer disposed in the first area and a common layer disposed in the first area and the second area, wherein the organic layer covers the first electrode;
a second electrode covering at least the organic layer disposed in the first area and having a first opening exposing at least a portion of the organic layer disposed in the second area, wherein the second electrode is shared by all of the pixels;
a first capping structure substantially covering the second electrode; and
a second capping structure substantially covering the organic layer disposed in the second area, wherein the second capping structure has a first layer and a second layer provided on the first layer and having a lower refractive index than that of the first layer.

* * * * *